United States Patent [19]

Sheats

[11] Patent Number: 5,212,147

[45] Date of Patent: May 18, 1993

[54] METHOD OF FORMING A PATTERNED IN-SITU HIGH TC SUPERCONDUCTIVE FILM

[75] Inventor: James R. Sheats, Palo Alto, Calif.

[73] Assignee: Hewlett-Packard Company, Palo Alto, Calif.

[21] Appl. No.: 700,671

[22] Filed: May 15, 1991

[51] Int. Cl.⁵ .......................... B05D 5/12; H01L 39/00
[52] U.S. Cl. .......................... 505/1; 505/732; 505/728; 505/730; 427/62; 427/63; 156/643; 156/646; 156/637; 156/659.1; 156/661.1; 156/656
[58] Field of Search ............. 505/1, 732, 728, 730; 427/62, 63; 156/643, 661.1, 659.1, 656, 637, 646

[56] References Cited

U.S. PATENT DOCUMENTS

| | | | |
|---|---|---|---|
| 3,975,252 | 8/1976 | Fraser et al. | 156/656 |
| 4,650,543 | 3/1987 | Kishita et al. | 156/643 |
| 4,742,026 | 5/1988 | Vatus et al. | 437/245 |
| 4,764,245 | 8/1988 | Grewal | 156/643 |
| 4,882,312 | 11/1989 | Mogro-Campero et al. | 505/1 |
| 4,933,318 | 6/1990 | Heijman | 505/1 |
| 4,937,225 | 6/1990 | Kalonji et al. | 505/1 |
| 4,942,142 | 7/1990 | Itozaki et al. | 505/1 |
| 4,952,556 | 8/1990 | Mantese et al. | 505/1 |
| 4,952,557 | 8/1990 | Schmidt | 505/1 |

Primary Examiner—Shrive Beck
Assistant Examiner—Roy V. King

[57] ABSTRACT

A method of forming a patterned in-situ photoconductive film on a substrate including providing a patterned photoresist layer on upper and lower metallic layers formed on a substrate. The patterned photoresist layer is used to form an opening in the upper layer. The pattern in the upper layer thereby has an opening having a geometry substantially similar to a desired pattern of photoconductive material to be formed on the substrate. A portion of the lower layer is removed to form cantilevered regions of the upper layer adjacent to the opening. Superconductive material is then deposited on the substrate by directing the material through the opening at an angle generally perpendicular to the substrate. The superconductive film on the substrate within the lower layer is coated with a polymer. The upper and lower layers and all superconductive material on those layers are removed to leave the polymer-encapsulated superconductive material on the substrate. The polymer is removed by plasma etching that does not adversely affect the superconductive material. Thus, the superconductive material on the substrate is subjected only to post-deposition process steps of depositing the polymer and removing the polymer.

16 Claims, 2 Drawing Sheets

METHOD OF FORMING A PATTERNED IN-SITU HIGH TC SUPERCONDUCTIVE FILM

DESCRIPTION

1. Technical Field

The present invention relates generally to superconductive materials and more particularly to methods of forming a superconductive film on a substrate.

2. Background Art

It is known that certain materials, such as ceramic copper oxides, reach a superconducting state when cooled to a temperature below a certain critical temperature ($T_c$). It is also known that the characteristics of the superconductive material are strongly dependent upon the processing steps in forming and depositing the material. Processes for patterning superconductive material on a substrate are described in Schmidt U.S. Pat. Nos. 4,952,557, Mantese et al. 4,952,556, Kalonji et al. 4,937,225 and Mogro-Campero et al. 4,882,312.

When reduced to basics, the processes can be reduced to categories of "in-situ formation" and "post-deposition anneal formation." Superconductive films that are prepared by methods requiring post-deposition annealing are formed and then subjected to high temperatures. Each of the above-cited patents teaches a post-deposition anneal process. An anneal temperature exceeding 500° C. is typical, with the preferred temperature range sometimes exceeding 1000° C. Such high temperatures have the tendency of affecting the electrical and morphological characteristics of the material, particularly when formation requires application of photoresist polymer in contact with the superconductive material. Mobile ion contamination resulting from heating of the polymer and the superconductive material will degrade the material.

This migration problem in post-deposition anneal processing can be avoided by using a method referred to as "lift-off." The method includes depositing a resist and patterning the resist to include somewhat overhung profiles, i.e., a gap in the resist is narrower at the top than at the bottom. The superconducting material is then deposited using equipment which provides only normally incident deposition. Thus, the superconducting material on the resist is discontinuous with the superconducting material deposited on the substrate. When the resist is dissolved in a solvent, the superconducting material that is on top of the resist is lifted off and removed, leaving only the desired pattern of material on the substrate. The lift-off method has been used in the patterning of post-deposition annealed high $T_c$ superconductive films. However, the method does render the superconducting material more susceptible to particulate contamination.

It has been shown that in-situ films have superior electrical and morphological characteristics, and therefore are generally preferred over post-deposition annealed films for device applications. With regard to electrical characteristics, in-situ films have superior critical current densities ($J_c$) and surface resistances ($R_s$). Moreover, the films tend to have improved grain boundaries and exhibit an improvement in smoothness.

The above-described lift-off method cannot be used for in-situ film, since the deposition temperature of approximately 600° C. to 700° C., along with the presence of oxygen, would rapidly destroy the photoresist. In using methods other than lift-off, there is little or no degradation due to migration from the photoresist, since the film and resist are not subjected to high temperature processing after deposition. However, the in-situ films are adversely affected by the developer and acidic etching solutions and/or ion beams typically used in in-situ processing. Wet etching in certain non-aqueous solutions, such as bromine/ethanol or ethylenediaminetetraacetic acid has been shown to lead to less degradation than acid-based etching, but these etches are adversely affected by crystal orientation and are limited with respect to resolution. Alternatively, ion milling is capable of high resolution, but is relatively non-selective, i.e. it is not stopped by any substrate layer. Ion milling may lead to unacceptable damage along sidewalls of a film.

An object of the present invention is to provide a method of forming a patterned superconductive film on a substrate without method steps that have the tendency to adversely affect the electrical or morphological characteristics of the superconducting material. It is a further object to provide such a method that allows high resolution patterning.

SUMMARY OF THE INVENTION

The above objects have been met by a method of forming a superconductive film wherein no post-deposition process treatment of the film takes place other than resist coating and $O_2$ plasma resist-removal. It has been shown that the resist coating and $O_2$ plasma do not have degradative effects on superconducting film electrical properties such as $J_c$ and $R_s$.

The method includes depositing a lower inorganic layer on a substrate and depositing an upper inorganic layer on the lower layer. A photoresist layer is formed on the upper layer. The photoresist layer is patterned to provide at least one opening having an opening geometry substantially similar to the desired pattern of superconductive film to be deposited on the substrate.

The upper layer is etched to create a first gap having a geometry identical to the patterned opening of the photoresist layer. Isotropic etching removes material from the lower layer to form cantilevered regions of the upper layer adjacent to the opening. Superconducting material is then deposited on the substrate by directing the material through the opening in the upper layer at an angle generally perpendicular to the substrate.

Preferably, the isotropic etching of the lower layer has formed a second gap which allows deposition of the superconducting material as described above without contact of the material with the lower layer. A low viscosity solution of polymer is used to coat the superconductive film on the substrate. After coating by the polymer, the upper and lower layers can be removed without affect to the film, since the polymer seals the film from the ambient atmosphere. Lastly, the polymer is removed using $O_2$ plasma etching.

An advantage of the present invention is that limiting the superconductive film to post-deposition processing of polymer coating and polymer removal provides an in-situ film having superior electrical and morphological characteristics. Another advantage is that the process is intrinsically capable of high resolution. Resolution is limited only by the patterning of the photoresist layer atop the upper layer.

BEST MODE FOR CARRYING OUT THE INVENTION

Figure 1:
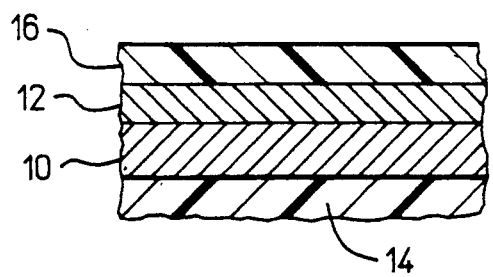
FIGS. 1, 2, 3, 4, 5, 6, 7 and 8 are side sectional views illustrating a sequence of processing steps for forming an in-situ superconductive film on a substrate.

With reference to FIG. 1, a masking structure having a lower layer 10 of niobium and an upper layer 12 of silver is shown as being sandwiched between a substrate 14 and a photoresist layer 16. The upper and lower layers may be deposited by conventional methods known in the art. For example, the layers may be formed by ion beam deposition, sputtering or evaporation. Likewise, the photoresist layer is conventionally formed. Spin-coating of the photoresist is typical.

The substrate 14 is of a type suitable for depositing high $T_c$ superconductive films. The substrate may be $LaAlO_3$, $LaGaO_3$, MgO, but other materials may be used. The lower layer should have a thickness that exceeds the desired thickness of the high $T_c$ film to be formed by approximately 500 nm. The upper film 12 should have a thickness of approximately 200-300 nm. While the thicknesses are not critical, the thickness of each layer should be constant across the entire substrate.

Figure 2:
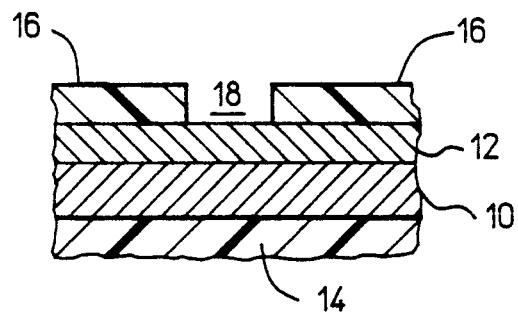

The photoresist layer 16 is then patterned to form an opening 18, as shown in FIG. 2. The method of patterning the photoresist should be one which provides high resolution, since the opening 18 indirectly dictates dimensions of the high $T_c$ film to be formed.

Figure 3:
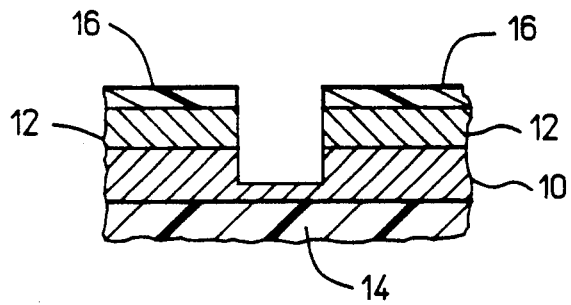

Referring now to FIG. 3, ion milling is used to transfer the pattern of the photoresist layer 16 through the upper layer 12 of silver. The ion milling typically will penetrate at least a portion of the lower layer 10 as well. The degree of penetration is not important. The result is the structure having a via 20 illustrated in FIG. 3.

Figure 4:
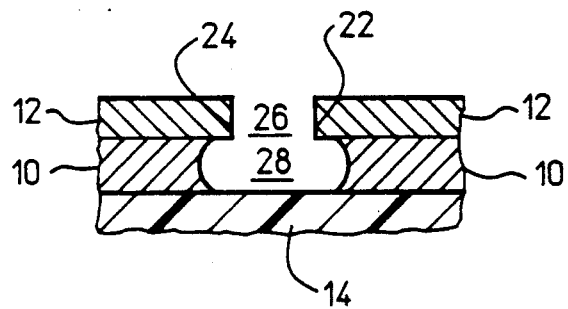

Anisotropic plasma etching removes the remainder of the lower layer 10 below the via 20. $CF_4$ and $O_2$ are typically used for this purpose. This also removes the photoresist layer. Isotropical etching in the same plasma then etches into the lower layer 10 to form cantilevered portions 22 and 24 in the upper layer 12, as shown in FIG. 4. The area of the second gap 28 as measured parallel to the substrate 14 is greater than the area of the first gap 26.

Figure 5:
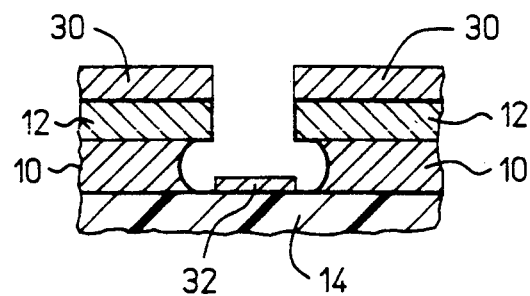

The next step is to deposit the high $T_c$ film 30 30 and 32 shown in FIG. 5. The film 30 and 32 may be $YBa_2Cu_3O_7$, but this is not critical. Deposition of the film is at an angle perpendicular to the surface of the substrate 14. The deposition is an anisotropic deposition. Deposition from varying angles would cover the entire surface of the substrate 14 exposed by etching into the lower layer 10. This is not a desired occurrence. What is preferred is that the formation of the film 32 on the substrate 14 have a length and a width dictated by the patterning of the upper layer 12.

Figure 6:
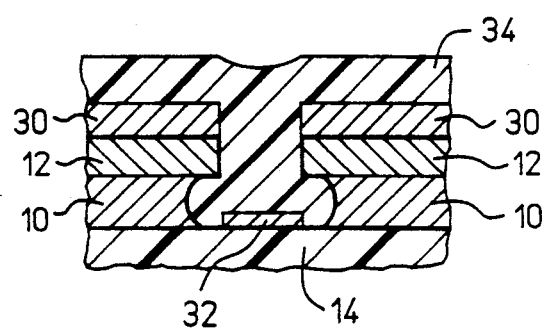

The structure of FIG. 6 is achieved by spin coating a low viscosity solution of polymer 34 onto the device. The polymer 34 provides a covering, and most importantly seals the high $T_c$ film 32 on the substrate 14 from the contact with the ambient atmosphere. The polymer may be a material typically used in the art as photoresist. Polyimide may also be used. The important characteristic of the sacrificial polymer 34 is that it flow readily into the gaps of the upper and lower layers 10 and 12 to completely encapsulate the high $T_c$ film 32. Flow phenomena in polymer spin-coating are well known in the art. The polymer should have a low molecular weight and be a low viscosity casting solution. The fusible and soluble phenol-formaldehyde sold under the trademark Novolac (Baekeland) is suitable.

Figure 7:
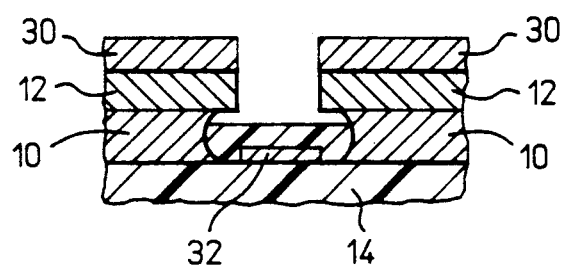

After spin-coating of the polymer 34, the polymer is given a bake sufficient to render it unreactive to acid stripping. For example, the bake may be at a temperature of 180° C. for a period of 60 seconds using a hot plate. Typically, the bake is performed after subjecting the polymer to an $O_2$ plasma for etching of the polymer to a level below the upper extent of the layer 12 of silver. This exposes the high $T_c$ film 30 on the upper layer 12 to subsequent processing steps, but a sufficient amount of polymer 34 remains to encapsulate the high $T_c$ film 32 on the substrate 14. The polymer is shown in FIG. 7 as being etched back below the upper extent of the niobium layer 10, but this is not necessary.

Figure 8:
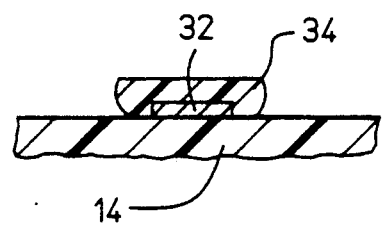

The upper and lower layers 10 and 12 and the high $T_c$ film layer 30 atop the upper layer 12 are removed using a suitable acidic etching solution. The entire structure illustrated in FIG. 7 may be dipped in the solution. The acidic solution is of the type which leaves the polymer 34 intact to provide the structure shown in FIG. 8. For example, a solution of 50% concentrated $HNO_3$ and 5% HF in water will remove 1 micron N6 film in approximately two minutes. Alternatively, if the substrate is reactive to acid, e.g. MgO, the N6 may be removed by $CF_4$ and $O_2$ plasma. The portion of the high $T_c$ film 32 which remains is that portion sandwiched between the substrate 14 and the polymer 34.

Figure 9:
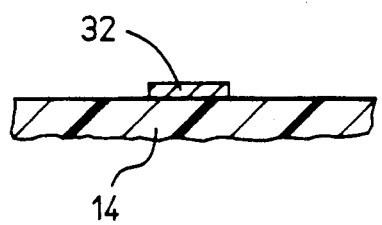
FIG. 9 is a side sectional view of a structure formed by following the steps of FIGS. 1-8.

Lastly, the polymer is removed by exposing the material to an $O_2$ plasma. As a result, the precisely deposited high $T_c$ film 32 is exposed for subsequent connection to other electrical paths. The exposed film 32 on the substrate 14 is shown in FIG. 9.

An advantage of the present invention is that the high $T_c$ film 32 which remains after completion of the process is exposed only to those processing steps of coating of the polymer and removal of the polymer 34. Experiments have shown that this does not affect the in-situ deposited film (as measured by $J_c$ and $R_s$) provided that post-deposition processing steps do not exceed a temperature of approximately 200° C.

The process is not limited to YBaCuO deposition. Other high $T_c$ materials may be used. Some examples are $Bi_2Sr_2Ca_1Cu_2O_8$, $Tl_2Ca_2Ba_2Cu_3O_{10}$ and $(Ba_{1-x}Rb_x)BiO_3$. All of these materials have the characteristics that the materials must be deposited at temperatures too high for conventional lift-off processing to reliably work, and that they contain elements that are not etchable by plasma chemistry and therefore require ion milling in conventional processing.

Niobium was described as the material for formation of the lower layer 10 because niobium is easily etched in a $CF_4/O_2$ plasma. However, other materials can be used, such as tantalum, tungsten, molybdenum and silicon. For purposes of the present invention, semiconductors, such as silicon, will be defined as metals. Use of different materials to form the lower layer 10 may require different methods for etching the materials.

Likewise, silver is not critical to formation of the upper layer 12. Silver is preferred because it is easily removed by an acidic etch solution, but is inert to the niobium etch and to the YBaCuO deposition conditions. Other materials satisfying these conditions could be used. For example, copper, nickel and gold are good substitutes.

The purpose of the anisotropical etching to the bottom of the niobium layer 10, as shown in FIG. 3, is to provide a starting point for an isotropic etch that tunnels uniformly under the silver layer 12. If no pre-etching takes place, the isotropic etching will provide a gap in the niobium layer that is larger at its upper extent than at the surface of the substrate 14. However, all of the niobium need not be removed in the anisotropic process step. Typically, the niobium layer is 1 micron thick to achieve a film layer 32 of 0.5 microns. Leaving 100 nm to 300 nm of niobium will achieve satisfactory results. This can be accomplished by the ion milling step, thereby eliminating the need of the anisotropic plasma etch of the niobium.

Ion milling of the upper layer 12 is needed if this layer is a highly inert material, as is desirable to achieve maximum selectivity between the upper layer 12 and the lower layer 10. However, it is possible to achieve considerable selectivity in plasma etching between niobium and silicon or silicon dioxide. Thus, silicon or silicon dioxide may be used as a substitute of silver. The final removal of the layers 10 and 12, however, would be more complicated since solutions other than aqueous acid would then be needed.

The present invention has the advantage of providing excellent latitude in selection of the steps beyond use of a photoresist patterning that achieves high resolution. Conventional lift-off processing requires delicate control of photoresist exposure and development to obtain a desired undercut profile, and requires careful control of the metal deposition process. Because the cantilevered portions 22 and 24 of the present invention are provided under conditions of high selectivity, the processing in achieving the desired structure of high $T_c$ film and protective capping is not difficult. The line width of the high $T_c$ film is determined solely by the width of the gap 26 in the upper layer 12, and not by the undercut of the lower layer 10. The process is intrinsically capable of very high resolution, limited only by resist patterning.

EXAMPLE

The structure of FIGS. 1-9 may be achieved by depositing a film of silver as the lower layer 10. The film could have a thickness of 1 micron, deposited by using an $Ar^+$ ion beam deposition system at 1150V, 1 mA/cm$^2$ beam current at a pressure of $4 \times 10^{-4}$ torr. The upper layer 12 could then be deposited without breaking vacuum to provide a film of gold having a thickness of 5000 Å. A photoresist, e.g., AZ5214E photoresist sold by AZ Photoresist Products, could be exposed in a projection aligner and developed to provide a series of openings as small as 5 microns. Such an opening 18 is shown in FIG. 2.

The initial etch of the lower and upper layers 10 and 12 of silver and gold may be by use of an $Ar^+$ ion beam at 600V, 700 $\mu$A/cm$^2$, pressure $4 \times 10^{-4}$ torr, with an angle of incidence of 45° for 47 minutes. The undercut 28 in the lower layer 10 of silver may be formed by etching in a 4:1:1 (by volume) of $CH_3OH:NH_4OH:H_2O_2$ solution, having an etch rate of approximately 60 Å/sec, for a period of six minutes. The result would be an undercut of approximately 2.5 microns on each side of the gap 26 in the upper layer 12.

Vacuum pressure plays a role in achieving a desired resolution in depositing the high $T_c$ film 32. Ideally, the mean free path ($\lambda$) at the deposition chamber pressure is greater than the distance (d) from a source, not shown, to the substrate 14. This distance is typically several centimeters. Smaller values of $\lambda$ could be tolerated, but would produce increasing amounts of broadening of the film 32 on the substrate 14, as well as sloping of the edges of the film 32. At 1 mtorr, $\lambda = 5$ cm. The mean free path is inversely proportional to pressure. Typically, in situ YBaCuO deposition processes run at approximately 5 mtorr for laser ablation, 200-300 mtorr for sputtering, 4 torr for metalorganic chemical vapor deposition and 0.1 mtorr for evaporation. Important is that the system pressure is affected by the manner in which oxygen is introduced. Systems that use oxygen excited by an electron cyclotron resonance plasma source can run at lower pressures. Thus, the invention may be used with a considerable range of deposition systems. No one method has been determined to yield films of higher quality than the others.

The polymer 34 may be spun to a thickness of 1.5 microns and then etched back to expose the upper layer 12 of gold, while still covering the superconductive film 32 on the substrate 14, by using an $O_2$ plasma at 240 mtorr, 100W rf power for a period of thirty minutes. The gold 12 may be removed by a $KI/I_2$ solution (4 g KI, 1 g $I_2$ in 4 ml water) and the silver 10 may be removed by mild acid, e.g., 10% $HNO_3$. The $O_2$ plasma may be reapplied to remove the remainder of the polymer 34.

I claim:

1. A method of forming an in-situ superconductive film on a surface comprising,
   forming a sacrificial masking structure on said surface to include a lower portion adjacent to said surface and an upper portion spaced apart from said surface by said lower portion, said forming including removing masking material from said lower portion to provide a first gap in said lower portion and including removing masking material from said upper portion to provide a second gap in said upper portion such that the area of said first gap as measured parallel to said surface is greater than the area of said second gap,
   depositing high $T_c$ superconductive material through said second gap such that a superconductive layer within said first gap has an area less than the area of said first gap,
   covering said superconductive layer within said first gap with a sacrificial polymer to seal said superconductive material from the ambient atmosphere,
   removing said sacrificial masking structure from said surface, and
   removing said sacrificial polymer to expose said superconductive layer.

2. The method of claim 1 wherein said step of forming said sacrificial masking layer includes depositing a first metallic layer on said surface and depositing a second metallic layer on said first layer, said step further including removing material from said first and second layers to form said first and second gaps, with a greater amount of material being removed from said first layer.

3. The method of claim 2 wherein said removing of material from said first and second layers includes etching through said second layer to create a via includes etching into said first layer to create a cantilevered area of said second layer adjacent to said via.

4. The method of claim 1 wherein said step of depositing high $T_c$ superconductive material is a step of directing said superconductive material through said second gap perpendicular to said surface, thereby forming a superconductive layer having an area substantially equal to the area of said second gap.

5. The method of claim 1 wherein said step of depositing high $T_c$ superconductive material is a step of utilizing an evaporation process in a high vacuum environment.

6. A method of forming patterned in-situ superconductive film on a substrate comprising, geometrically shaping a sacrificial masking structure on a substrate surface to include lower and upper sacrificial layers, including forming said lower sacrificial layer such that first internal walls define a first gap and including forming said upper sacrificial layer such that second internal walls define a second gap and such that said first internal walls are spaced apart by a horizontal distance greater than said second internal walls, directing high $T_c$ superconductive material through said second gap at an angle generally perpendicular to said substrate surface so that a superconductive layer is formed within said first gap in a pattern dictated by dimensions of said second gap, depositing sacrificial polymeric material on said superconductive layer in said first gap to enclose said superconductive layer, removing said sacrificial masking structure, and removing said sacrificial polymeric material.

7. The method of claim 6 wherein said step of geometrically shaping said sacrificial masking structure includes forming cantilevered sections of said upper sacrificial layer adjacent to said first internal walls.

8. The method of claim 6 wherein said forming a lower sacrificial layer includes choosing a material from the group consisting of Nb, Ta, W, Mo, Ag and Si.

9. The method of claim 8 wherein said forming an upper sacrificial layer includes choosing a material from the group consisting of silver, gold, copper and nickel.

10. The method of claim 8 wherein said step of directing high $T_c$ superconductive material is a directing of YBaCuO.

11. The method of claim 8 wherein said step of geometrically shaping said sacrificial masking structure includes an isotropical etching of said lower sacrificial layer.

12. A method of forming a patterned superconductive film on a substrate comprising, depositing a first sacrificial metallic layer of material on said substrate, depositing a second sacrificial metallic layer of material on said first layer, depositing a photoresist layer on said second layer, using said photoresist layer to form an opening in said second sacrificial metallic layer having an opening geometry substantially similar to a desired pattern of superconductive material to be formed on said substrate, removing a portion of said material from said first sacrificial metallic layer to form cantilevered regions of said second sacrificial metallic layer adjacent to said opening, depositing a high $T_c$ superconductive material on said substrate by directing said superconductive material through said opening at an angle generally perpendicular to said substrate, coating said superconductive material on said substrate with a sacrificial polymer, removing said first sacrificial metallic layer and all material deposited thereon to leave said sacrificial polymer and said superconductive material on said substrate, and removing said sacrificial polymer.

13. The method of claim 12 wherein said step of removing a portion of said material from said first sacrificial metallic layer is an isotropic etching step.

14. The method of claim 12 wherein said step of depositing said high $T_c$ superconductive material is a step of utilizing an evaporation process.

15. The method of claim 12 further comprising etching said sacrificial polymer to a level below an upper extent of said first sacrificial metallic layer prior to said step of removing said first sacrificial metallic layer.

16. The method of claim 12 wherein said steps of depositing said first and second sacrificial metallic layers are steps of depositing metal.

* * * * *

UNITED STATES PATENT AND TRADEMARK OFFICE
CERTIFICATE OF CORRECTION

PATENT NO. : 5,212,147
DATED : May 18, 1993
INVENTOR(S) : James R. Sheats It is certified that error appears in the above-identified patent and that said Letters Patent is hereby corrected as shown below:

On the title page, Item [57], in the abstract, line 1, change "photoconductive" to --superconductive--;

On the title page, Item [57], in the abstract, line 8, change "photoconductive" to --superconductive--;

Column 4, line 28, change "N6" to --Nb--;

Column 4, line 30, change "N6" to --Nb--.

Signed and Sealed this

Sixth Day of September, 1994

*Attest:*

BRUCE LEHMAN

*Attesting Officer*     *Commissioner of Patents and Trademarks*